(12) United States Patent
Arimilli et al.

(10) Patent No.: US 7,770,077 B2
(45) Date of Patent: Aug. 3, 2010

(54) USING CACHE THAT IS EMBEDDED IN A MEMORY HUB TO REPLACE FAILED MEMORY CELLS IN A MEMORY SUBSYSTEM

(75) Inventors: Ravi K. Arimilli, Austin, TX (US); Kevin C. Gower, LaGrangeville, NY (US); Warren E. Maule, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 178 days.

(21) Appl. No.: 12/019,141

(22) Filed: Jan. 24, 2008

(65) Prior Publication Data

US 2009/0193290 A1   Jul. 30, 2009

(51) Int. Cl.
*G11C 29/00* (2006.01)
(52) U.S. Cl. .................. 714/710; 714/718; 714/764
(58) Field of Classification Search .................. 714/710
See application file for complete search history.

(56) References Cited

U.S. PATENT DOCUMENTS

| | | | |
|---|---|---|---|
| 5,367,643 | A | 11/1994 | Chang et al. |
| 5,386,540 | A | 1/1995 | Young et al. |
| 5,513,135 | A | 4/1996 | Dell et al. |
| 5,598,113 | A | 1/1997 | Jex et al. |
| 5,640,349 | A | 6/1997 | Kakinuma et al. |
| 5,867,731 | A | 2/1999 | Williams et al. |
| 5,887,272 | A | 3/1999 | Sartore et al. |
| 5,896,404 | A | 4/1999 | Kellogg et al. |
| 6,049,476 | A | 4/2000 | Laudon et al. |
| 6,095,827 | A | 8/2000 | Dutkowsky et al. |
| 6,109,929 | A | 8/2000 | Jasper |
| 6,141,728 | A | 10/2000 | Simionescu et al. |
| 6,263,448 | B1 | 7/2001 | Tsern et al. |
| 6,279,072 | B1 | 8/2001 | Williams et al. |
| 6,356,500 | B1 | 3/2002 | Cloud et al. |
| 6,397,287 | B1 | 5/2002 | Brown et al. |

(Continued)

FOREIGN PATENT DOCUMENTS

WO   WO 99/49468   9/1999

OTHER PUBLICATIONS

U.S. Appl. No. 11/613,363, filed Dec. 20, 2006, Pham et al.

(Continued)

*Primary Examiner*—Kevin L Ellis
*Assistant Examiner*—Ebrahim Golabbakhsh
(74) *Attorney, Agent, or Firm*—Francis Lammes; Stephen J. Walder, Jr.; Diana R. Gerhardt

(57) ABSTRACT

A mechanism is provided for using a cache that is embedded in a memory hub device to replace failed memory cells. A memory module comprises an integrated memory hub device. The memory hub device comprises an integrated memory device data interface that communicates with a set of memory devices coupled to the memory hub device and a cache integrated in the memory hub device. The memory hub device also comprises an integrated memory hub controller that controls the data that is read or written by the memory device data interface to the cache based on a determination whether one or more memory cells within the set of memory devices has failed.

18 Claims, 4 Drawing Sheets

U.S. PATENT DOCUMENTS

| | | | |
|---|---|---|---|
| 6,397,290 B1 | 5/2002 | Williams et al. | |
| 6,401,149 B1 | 6/2002 | Dennin et al. | |
| 6,415,349 B1 | 7/2002 | Hull et al. | |
| 6,418,068 B1 | 7/2002 | Raynham | |
| 6,477,614 B1 | 11/2002 | Leddige et al. | |
| 6,507,887 B1 | 1/2003 | Pontius et al. | |
| 6,512,644 B1 | 1/2003 | Hall et al. | |
| 6,584,543 B2 | 6/2003 | Williams et al. | |
| 6,683,372 B1 | 1/2004 | Wong et al. | |
| 6,721,864 B2 | 4/2004 | Keskar et al. | |
| 6,785,837 B1* | 8/2004 | Kilmer et al. | 714/7 |
| 6,789,169 B2 | 9/2004 | Jeddeloh | |
| 6,821,144 B2 | 11/2004 | Choy | |
| 6,822,960 B1 | 11/2004 | Manchester et al. | |
| 6,848,060 B2 | 1/2005 | Cook et al. | |
| 6,889,284 B1 | 5/2005 | Nizar et al. | |
| 6,910,145 B2 | 6/2005 | MacLellan et al. | |
| 6,938,119 B2 | 8/2005 | Kohn et al. | |
| 6,952,745 B1 | 10/2005 | Dodd et al. | |
| 6,961,281 B2 | 11/2005 | Wong et al. | |
| 6,982,892 B2 | 1/2006 | Lee et al. | |
| 7,043,611 B2 | 5/2006 | McClannahan et al. | |
| 7,054,179 B2 | 5/2006 | Cogdill et al. | |
| 7,103,730 B2 | 9/2006 | Saxena et al. | |
| 7,111,143 B2 | 9/2006 | Walker | |
| 7,114,117 B2 | 9/2006 | Tamura et al. | |
| 7,117,328 B2 | 10/2006 | Shibuya et al. | |
| 7,120,727 B2 | 10/2006 | Lee et al. | |
| 7,124,332 B2 | 10/2006 | Constantinescu | |
| 7,133,972 B2* | 11/2006 | Jeddeloh | 711/137 |
| 7,143,246 B2 | 11/2006 | Johns | |
| 7,162,669 B2 | 1/2007 | Gross | |
| 7,200,021 B2 | 4/2007 | Raghuram | |
| 7,200,023 B2 | 4/2007 | Foster, Sr. | |
| 7,203,874 B2 | 4/2007 | Roohparvar | |
| 7,210,015 B2 | 4/2007 | Barth et al. | |
| 7,216,196 B2 | 5/2007 | Jeddeloh | |
| 7,225,303 B2 | 5/2007 | Choi | |
| 7,234,099 B2 | 6/2007 | Gower et al. | |
| 7,269,042 B2 | 9/2007 | Kinsley et al. | |
| 7,272,070 B2 | 9/2007 | Hummler | |
| 7,558,124 B2 | 7/2009 | Wu et al. | |
| 7,558,887 B2 | 7/2009 | Gower et al. | |
| 7,577,039 B2 | 8/2009 | Yang et al. | |
| 7,584,308 B2 | 9/2009 | Gower et al. | |
| 2002/0112119 A1 | 8/2002 | Halbert et al. | |
| 2003/0037280 A1* | 2/2003 | Berg et al. | 714/6 |
| 2003/0061447 A1 | 3/2003 | Perego et al. | |
| 2003/0097526 A1* | 5/2003 | Chiu et al. | 711/117 |
| 2003/0137862 A1 | 7/2003 | Brunelle et al. | |
| 2004/0006674 A1 | 1/2004 | Hargis et al. | |
| 2004/0024971 A1 | 2/2004 | Bogin et al. | |
| 2004/0109468 A1 | 6/2004 | Anjanaiah | |
| 2004/0117566 A1 | 6/2004 | McClannahan et al. | |
| 2004/0128464 A1 | 7/2004 | Lee et al. | |
| 2004/0213074 A1 | 10/2004 | Johnson et al. | |
| 2004/0236877 A1 | 11/2004 | Burton | |
| 2005/0033921 A1 | 2/2005 | Jeddeloh | |
| 2005/0050255 A1* | 3/2005 | Jeddeloh | 710/317 |
| 2005/0125702 A1 | 6/2005 | Huang et al. | |
| 2005/0138267 A1 | 6/2005 | Bains et al. | |
| 2005/0138302 A1 | 6/2005 | Lusk et al. | |
| 2005/0160250 A1 | 7/2005 | Yoshimi | |
| 2005/0216677 A1* | 9/2005 | Jeddeloh et al. | 711/150 |
| 2005/0223161 A1* | 10/2005 | Jeddeloh | 711/105 |
| 2006/0095592 A1 | 5/2006 | Borkenhagen | |
| 2006/0117322 A1 | 6/2006 | Gimness et al. | |
| 2006/0123261 A1 | 6/2006 | Riley et al. | |
| 2006/0158917 A1 | 7/2006 | Bartley et al. | |
| 2006/0179262 A1 | 8/2006 | Brittain et al. | |
| 2006/0212775 A1 | 9/2006 | Cypher | |
| 2006/0235901 A1 | 10/2006 | Chan | |
| 2006/0245226 A1 | 11/2006 | Stewart | |
| 2006/0271755 A1 | 11/2006 | Miura | |
| 2006/0288132 A1 | 12/2006 | McCall et al. | |
| 2007/0005922 A1 | 1/2007 | Swaminathan et al. | |
| 2007/0011392 A1 | 1/2007 | Lee et al. | |
| 2007/0011562 A1 | 1/2007 | Alexander et al. | |
| 2007/0016718 A1 | 1/2007 | Radhakrishnan et al. | |
| 2007/0033317 A1* | 2/2007 | Jeddeloh | 710/317 |
| 2007/0050530 A1 | 3/2007 | Rajan | |
| 2007/0098020 A1 | 5/2007 | Ja et al. | |
| 2007/0106860 A1 | 5/2007 | Foster et al. | |
| 2007/0111606 A1 | 5/2007 | Goodwin | |
| 2007/0150672 A1 | 6/2007 | Alexander et al. | |
| 2007/0162648 A1 | 7/2007 | Tousek | |
| 2007/0162654 A1 | 7/2007 | Miwa | |
| 2007/0230230 A1 | 10/2007 | Hofstra | |
| 2007/0260841 A1 | 11/2007 | Hampel et al. | |
| 2008/0031030 A1 | 2/2008 | Rajan et al. | |
| 2008/0170425 A1 | 7/2008 | Rajan | |
| 2008/0215792 A1* | 9/2008 | Jeddeloh | 710/317 |
| 2009/0019195 A1 | 1/2009 | Djordjevic | |
| 2009/0063729 A1 | 3/2009 | Gower et al. | |
| 2009/0063730 A1 | 3/2009 | Gower et al. | |
| 2009/0063731 A1 | 3/2009 | Gower et al. | |
| 2009/0063761 A1 | 3/2009 | Gower et al. | |
| 2009/0063784 A1 | 3/2009 | Gower et al. | |
| 2009/0063785 A1 | 3/2009 | Gower et al. | |
| 2009/0063787 A1 | 3/2009 | Gower et al. | |
| 2009/0063922 A1 | 3/2009 | Gower et al. | |
| 2009/0063923 A1 | 3/2009 | Gower et al. | |
| 2009/0125788 A1* | 5/2009 | Wheeler et al. | 714/764 |
| 2009/0190427 A1 | 7/2009 | Brittain et al. | |
| 2009/0190429 A1 | 7/2009 | Brittain et al. | |
| 2009/0193200 A1 | 7/2009 | Brittain et al. | |
| 2009/0193201 A1 | 7/2009 | Brittain et al. | |
| 2009/0193203 A1 | 7/2009 | Brittain et al. | |
| 2009/0193315 A1 | 7/2009 | Gower et al. | |

OTHER PUBLICATIONS

Nasr, Rami Marwan, "FBSIM and the Fully Buffered DIMM Memory System Architecture", Thesis, 2005, 138 pages.

Lin et al., "DRAM-Level Prefetching for Fully-Buffered DIMM: Design, Performance and Power Saving", ISPASS, 2007, pp. 1-36.

"Quad-Core and Dual-Core Intel Xeon Processor-based Two-Processor Workstations", Intel, see "fully buffered DIMM technology", Oct. 5, 2006, p. 8.

John, Lizy Kurian, "VaWiRAM: A Variable Width Random Access Memory Module", 9th International Conference on VLSI Design, Jan. 1996, pp. 219-224.

Woodacre et al., "The SGI Altix 3000 Global Shared-Memory Architecture", Silicon Graphics, Incorporated, White Paper, 2003.

Haas et al., "Fully-Buffered DIMM Technology Moves Enterprise Platforms to the Next Level", Technology @ Intel Magazine, Mar. 2005, pp. 1-7.

Arimilli et al., "Asynchronous Generation of DRAM Controls from Micro Channel Signals", IBM Technical Disclosure, No. 6, 1992, p. 372.

Howell, J.H., "Dual-Port Control Signal Generator", IBM Technical Disclosure, 1988, pp. 102-104.

Karp et al., "Clock Synchronization Method Speeds Processor Access to Memory", IBM Technical Disclosure, yvol. 38, No. 11, 1995, pp. 7-8.

Alghazo, Jaafar et al., "SF-LRU Cache Replacement Algorithm", Records of the 2004 International Workshop on Memory Technology, Design and Testing (MTDT), Aug. 2004, 6 pages.

Delaluz, V. et al., "Scheduler-Based DRAM Energy Management", Proceedings of the 2002 Design Automation Conference (IEEE Cat. No. 02CH37324), Jun. 2002, pp. 697-702.

Huang, Hai et al., "Improving Energy Efficiency by Making DRAM Less Randomly Accessed", Proceedings of the 2005 International Symposium on Low Power Electronics and Design (IEEE Cat. No. 05th 8842), Aug. 2005, pp. 393-398.

Huang, Hai et al., "Method and System for Decreasing Power Consumption in Memory Array", DOSS #AUS920050254, Jul. 2005, 5 pages.

Park, Jin H. et al., "Coarse Grained Power Management", Proceedings of the International Conference on Embedded Systems and Applications, ESA, 2003, pp. 248-254.

U.S. Appl. No. 11/848,309, filed Aug. 31, 2007, Gower et al.
U.S. Appl. No. 11/850,190, filed Sep. 5, 2007, Gower et al.
U.S. Appl. No. 11/848,312, filed Aug. 31, 2007, Gower et al.
U.S. Appl. No. 11/850,290, filed Sep. 5, 2007, Gower et al.
U.S. Appl. No. 11/848,318, filed Aug. 31, 2007, Gower et al.
U.S. Appl. No. 11/848,322, filed Aug. 31, 2007, Gower et al.
U.S. Appl. No. 11/848,335, filed Aug. 31, 2007, Gower et al.
U.S. Appl. No. 11/848,342, filed Aug. 31, 2007, Gower et al.
U.S. Appl. No. 11/848,349, filed Aug. 31, 2007, Gower et al.
U.S. Appl. No. 11/850,353, filed Sep. 5, 2007, Gower et al.
U.S. Appl. No. 11/848,354, filed Aug. 31, 2007, Gower et al.
U.S. Appl. No. 12/018,926, filed Jan. 24, 2008, Gower et al.
U.S. Appl. No. 12/019,071, filed Jan. 24, 2008, Brittain et al.
U.S. Appl. No. 12/019,043, filed Jan. 24, 2008, Brittain et al.
U.S. Appl. No. 12/019,095, filed Jan. 24, 2008, Brittain et al.
U.S. Appl. No. 12/018,952, filed Jan. 24, 2008, Brittain et al.
U.S. Appl. No. 12/018,972, filed Jan. 24, 2008, Brittain et al.
U.S. Appl. No. 11/848,309, Image File Wrapper printed from PAIR on Mar. 1, 2010, 1 page.
U.S. Appl. No. 11/848,312, Image File Wrapper printed from PAIR on Mar. 1, 2010, 2 pages.
U.S. Appl. No. 11/848,318, Image File Wrapper printed from PAIR on Mar. 1, 2010, 2 pages.
U.S. Appl. No. 11/848,322, Image File Wrapper printed from PAIR on Mar. 1, 2010, 2 pages.
U.S. Appl. No. 11/848,335, Image File Wrapper printed from PAIR on Mar. 1, 2010, 2 pages.
U.S. Appl. No. 11/848,342, Image File Wrapper printed from PAIR on Mar. 1, 2010, 2 pages.
U.S. Appl. No. 11/848,349, Image File Wrapper printed from PAIR on Mar. 1, 2010, 1 page.
U.S. Appl. No. 11/848,354, Image File Wrapper printed from PAIR on Mar. 1, 2010, 1 page.
U.S. Appl. No. 11/850,190, Image File Wrapper printed from PAIR on Mar. 1, 2010, 1 page.
U.S. Appl. No. 11/850,290, Image File Wrapper printed from PAIR on Mar. 1, 2010, 2 pages.
U.S. Appl. No. 11/850,353, Image File Wrapper printed from PAIR on Mar. 1, 2010, 1 page.
U.S. Appl. No. 12/018,926, Image File Wrapper printed from PAIR on Mar. 1, 2010, 2 pages.
U.S. Appl. No. 12/018,952, Image File Wrapper printed from PAIR on Mar. 1, 2010, 1 page.
U.S. Appl. No. 12/018,972, Image File Wrapper printed from PAIR on Mar. 1, 2010, 1 page.
U.S. Appl. No. 12/019,043, Image File Wrapper printed from PAIR on Mar. 1, 2010, 1 page.
U.S. Appl. No. 12/019,071, Image File Wrapper printed from PAIR on Mar. 1, 2010, 2 pages.
U.S. Appl. No. 12/019,095, Image File Wrapper printed from PAIR on Mar. 1, 2010, 2 pages.
Interview Summary mailed Mar. 4, 2010 for U.S. Appl. No. 11/848,322; 3 pages.
Interview Summary mailed Apr. 5, 2010 for U.S. Appl. No. 11/848,318, 3 pages.
Office Action mailed Mar. 5, 2010 for U.S. Appl. No. 11/848,309, 27 pages.
Office Action mailed Feb. 26, 2010 for U.S. Appl. No. 11/848,312, 23 pages.
Response to Office Action filed with the USPTO on Mar. 5, 2010 for U.S. Appl. No. 11/848,322, 14 pages.

* cited by examiner

USING CACHE THAT IS EMBEDDED IN A MEMORY HUB TO REPLACE FAILED MEMORY CELLS IN A MEMORY SUBSYSTEM

GOVERNMENT RIGHTS

This invention was made with United States Government support under Agreement No. HR0011-07-9-0002 awarded by DARPA. THE GOVERNMENT HAS CERTAIN RIGHTS IN THE INVENTION.

BACKGROUND

1. Technical Field

The present application relates generally to an improved data processing system. More specifically, the present application is directed to using cache that is embedded in a memory hub to replace failed memory cells in a memory subsystem.

2. Description of Related Art

Contemporary high performance computing main memory systems are generally composed of one or more dynamic random access memory (DRAM) devices, which are connected to one or more processors via one or more memory control elements. Overall computer system performance is affected by each of the key elements of the computer structure, including the performance/structure of the processor(s), any memory cache(s), the input/output (I/O) subsystem(s), the efficiency of the memory control function(s), the main memory device(s), and the type and structure of the memory interconnect interface(s).

Extensive research and development efforts are invested by the industry, on an ongoing basis, to create improved and/or innovative solutions to maximizing overall system performance and density by improving the memory system/subsystem design and/or structure. High-availability computer systems present further challenges as related to overall system reliability due to customer expectations that new computer systems will markedly surpass existing systems in regard to mean-time-before-failure (MTBF), in addition to offering additional functions, increased performance, increased storage, lower operating costs, etc. Other frequent customer requirements further exacerbate the memory system design challenges, and include such items as ease of upgrade and reduced system environmental impact, such as space, power, and cooling.

Thus, computer system designs are intended to run for extremely long periods of time without failing or needing to be powered down to replace faulty components. However, over time memory cells in DRAM chips or other memory subsystems can fail and potentially cause errors when accessed. These individual bad memory cells can result in large blocks of memory being taken out of the memory maps for the memory system. Further, the loss of the memory can lead to performance issues in the computer system and result in a computer system repair action to replace faulty components.

SUMMARY

In order to reduce performance issues within a computer system and reduce repair actions due to memory system/subsystem failures, the illustrative embodiments use cache that is embedded in a memory hub device of a memory module to replace failed memory cells within a memory device of the memory module. When a memory controller detects an error in data that is read from a memory device on a memory module, the memory controller will correct the data for use internally to the computer system and attempt to correct the error in memory by writing the corrected data back to the memory device replacing the data that is in error the in memory device with the corrected data. Then, the memory controller rereads the data from the memory device and checks the data for errors to verify that the data has been corrected.

If the data is correct on the second read then the error was a transient error and the memory controller logs the error as a soft failure or transient error. However, if the data is still incorrect on the second read, then the memory controller logs the specific memory cell(s) in the memory device as bad and indicates that the memory device and/or memory module as needing to be repaired or replaced. In known systems this location in memory would either have to be taken out of the system's valid memory space or replaced with a service action. With this embodiment the memory controller will instead repair the failing location in memory by replacing it with a spare location in a cache in the memory hub or in the memory controller. To repair the memory location the memory controller will issue a write operation to the cache that is embedded in the memory hub device or the memory controller with the corrected data for the faulty memory cell(s) in the memory device. Once the write of the corrected data is complete, all read and/or write operations from the memory controller will use the data from the cache instead of the data from the memory device.

The illustrative embodiments provide mechanisms for using cache that is embedded in a memory hub device to replace failed memory cells. The illustrative embodiments provide a memory system that comprises a memory hub device integrated in a memory module. The illustrative embodiments also comprise a memory device data interface integrated in the memory hub device that communicates with a set of memory devices coupled to the memory hub device and a cache integrated in the memory hub device. The illustrative embodiments further comprise a memory hub controller integrated in the memory hub device, wherein the memory hub controller controls the data that is read or written by the memory device data interface to the cache based on a determination whether one or more memory cells within the set of memory devices has failed.

In determining whether one or more memory cells within the set of memory devices have failed, the illustrative embodiments may detect an error in read data that is read from the one or more memory cells. The illustrative embodiments may correct the error in the read data thereby forming corrected data. The illustrative embodiments may write the corrected data to the one or more memory cells. The illustrative embodiments may reread the corrected data from the one or more memory cells. The illustrative embodiments may determine if the error still exists within the corrected data. Responsive to a persistence of first error in the corrected data, the illustrative embodiments may indicate the one or more memory cells as failed.

Responsive to an absence of the error, the illustrative embodiments may further record the error as a transient error. In the illustrative embodiments the cache may be at least one of content addressable cache or address mapped cache. In the illustrative embodiments the memory hub device may further comprise a link interface, coupled to the memory device data interface and the memory hub controller that provides a communication path between the memory module and an external memory controller. In the illustrative embodiments the memory hub controller may control the transfer of data between the memory device data interface and the link interface.

In the illustrative embodiments the memory hub device may further comprise a first multiplexer coupled to the link interface and a second multiplexer in the memory device data interface and a read data queue coupled to the first multiplexer and the second multiplexer in the memory device data interface. In the illustrative embodiments the memory hub controller may control the transfer of data between the second multiplexer and the link interface by sending one or more control signals to the first multiplexer to select either a direct input from the a second multiplexer or an input from the read data queue for output by the first multiplexer to the link interface.

In the illustrative embodiments the memory hub controller may control the transfer of data between at least one of the set of memory devices or the cache to the first multiplexer by sending one or more control signals to the second multiplexer to select either data from the set of memory devices or the data from the cache. In the illustrative embodiments the memory hub controller may send a control signal to the second multiplexer to select the input from the cache or the set of memory devices based an address of the data.

In the illustrative embodiments the memory hub controller may send a control signal to the first multiplexer to select the input from the read data queue based on a state of the read data queue and a state of the link interface. In the illustrative embodiments the memory module may be one of a dual in-line memory module (DIMM) or a single in-line memory module (SIMM). In the illustrative embodiments the memory module may be part of a data processing device. In the illustrative embodiments the memory module may be part of a main memory of a data processing system.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE ILLUSTRATIVE EMBODIMENTS

Figure 1:
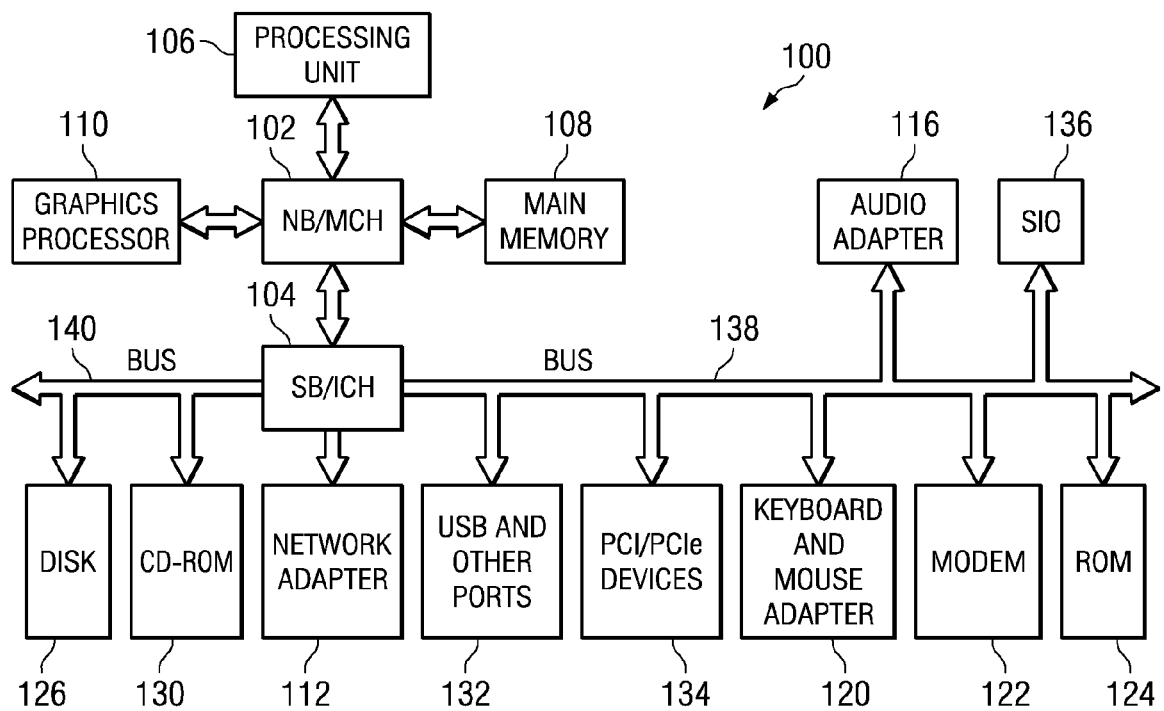
FIG. 1 is a block diagram of an exemplary data processing system in which aspects of the illustrative embodiments may be implemented.

The illustrative embodiments provide mechanisms for using cache that is embedded in a memory hub device of a memory module to replace failed memory cells within a memory device of the memory module. As such, the mechanisms of the illustrative embodiments may be used with any of a number of different types of data processing devices and environments. For example, the memory system of the illustrative embodiments may be utilized with data processing devices such as servers, client data processing systems, stand-alone data processing systems, or any other type of data processing device. Moreover, the memory systems of the illustrative embodiments may be used in other electronic devices in which memories are utilized including printers, facsimile machines, storage devices, flashdrives, or any other electronic device in which a memory is utilized. In order to provide a context for the description of the mechanisms of the illustrative embodiments, and one example of a device in which the illustrative embodiments may be implemented, FIG. 1 is provided hereafter as an exemplary diagram of a data processing environment in which embodiments of the present invention may be implemented. It should be appreciated that FIG. 1 is only exemplary and is not intended to assert or imply any limitation with regard to the environments in which aspects or embodiments of the present invention may be implemented. Many modifications to the depicted environments may be made without departing from the spirit and scope of the present invention.

With reference now to FIG. 1, a block diagram of an exemplary data processing system is shown in which aspects of the illustrative embodiments may be implemented. Data processing system 100 is an example of a computer in which computer usable code or instructions implementing the processes for illustrative embodiments of the present invention may be located.

In the depicted example, data processing system 100 employs a hub architecture including north bridge and memory controller hub (NB/MCH) 102 and south bridge and input/output (I/O) controller hub (SB/ICH) 104. Processing unit 106, main memory 108, and graphics processor 110 are connected to NB/MCH 102. Graphics processor 110 may be connected to NB/MCH 102 through an accelerated graphics port (AGP).

In the depicted example, local area network (LAN) adapter 112 connects to SB/ICH 104. Audio adapter 116, keyboard and mouse adapter 120, modem 122, read only memory (ROM) 124, hard disk drive (HDD) 126, CD-ROM drive 130, universal serial bus (USB) ports and other communication ports 132, and PCI/PCIe devices 134 connect to SB/ICH 104 through bus 138 and bus 140. PCI/PCIe devices may include, for example, Ethernet adapters, add-in cards, and PC cards for notebook computers. PCI uses a card bus controller, while PCIe does not. ROM 124 may be, for example, a flash binary input/output system (BIOS).

HDD 126 and CD-ROM drive 130 connect to SB/ICH 104 through bus 140. HDD 126 and CD-ROM drive 130 may use, for example, an integrated drive electronics (IDE) or serial advanced technology attachment (SATA) interface. Super I/O (SIO) device 136 may be connected to SB/ICH 104.

An operating system runs on processing unit 106. The operating system coordinates and provides control of various components within the data processing system 100 in FIG. 1. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 100 (Java is a trademark of Sun Microsystems, Inc. in the United States, other countries, or both).

As a server, data processing system 100 may be, for example, an IBM® eServer™ System p® computer system, running the Advanced Interactive Executive (AIX™) operating system or the LINUX® operating system (eServer, System p, and AIX are trademarks of International Business Machines Corporation in the United States, other countries, or both while LINUX is a trademark of Linus Torvalds in the United States, other countries, or both). Data processing system 100 may be a symmetric multiprocessor (SMP) system including a plurality of processors in processing unit 106. Alternatively, a single processor system may be employed.

Instructions for the operating system, the object-oriented programming system, and applications or programs are located on storage devices, such as HDD 126, and may be loaded into main memory 108 for execution by processing unit 106. The processes for illustrative embodiments of the present invention may be performed by processing unit 106 using computer usable program code, which may be located in a memory such as, for example, main memory 108, ROM 124, or in one or more peripheral devices 126 and 130, for example.

A bus system, such as bus 138 or bus 140 as shown in FIG. 1, may be comprised of one or more buses. Of course, the bus system may be implemented using any type of communication fabric or architecture that provides for a transfer of data between different components or devices attached to the fabric or architecture. A communication unit, such as modem 122 or network adapter 112 of FIG. 1, may include one or more devices used to transmit and receive data. A memory may be, for example, main memory 108, ROM 124, or a cache such as found in NB/MCH 102 in FIG. 1.

Those of ordinary skill in the art will appreciate that the hardware in FIG. 1 may vary depending on the implementation. Other internal hardware or peripheral devices, such as flash memory, equivalent non-volatile memory, or optical disk drives and the like, may be used in addition to or in place of the hardware depicted in FIG. 1. Also, the processes of the illustrative embodiments may be applied to a multiprocessor data processing system, other than the SMP system mentioned previously, without departing from the spirit and scope of the present invention.

Moreover, the data processing system 100 may take the form of any of a number of different data processing systems including client computing devices, server computing devices, a tablet computer, laptop computer, telephone or other communication device, a personal digital assistant (PDA), or the like. In some illustrative examples, data processing system 100 may be a portable computing device which is configured with flash memory to provide non-volatile memory for storing operating system files and/or user-generated data, for example. In other illustrative embodiments, data processing device 100 may be any type of digital commercial product that utilizes a memory system in accordance with the illustrative embodiments, as discussed hereafter. For example, data processing device 100 may be a printer, facsimile machine, flash memory device, wireless communication device, game system, portable video/music player, or any other type of consumer electronic device. Essentially, data processing system 100 may be any known or later developed data processing system without architectural limitation.

Furthermore, data processing device 100 may employ many different types of memory for main memory 108. In some illustrative embodiments, main memory 108 may be a memory module, such as a dual in-line memory module (DIMM), single in-line memory module (SIMM), or other memory module or card structure. In general, a DIMM refers to a small circuit board or substrate that is comprised primarily of random access memory (RAM) integrated circuits, or dies, on one or both sides, i.e. planar surfaces, of the circuit board/substrate with signal and/or power pins along both sides of a common edge of the circuit board/substrate. A SIMM refers to a small circuit board or substrate composed primarily of RAM integrated circuits, or dies, on one or both sides, i.e. planar surfaces, of the circuit board/substrate and pins generally along both long edges, with each pin connected to the pin directly (or slightly offset from the pin) on the adjacent side.

Thus, RAM may be one type of memory used for storing programs and data in main memory 108 of data processing system 100. RAM provides temporary read/write storage while hard disks offer semi-permanent storage. The term random derives from the fact that processing unit 106 may retrieve data from any individual location, or address, within RAM. Most RAM is volatile, which means that it requires a steady flow of electricity to maintain its contents. As soon as the power is turned off, whatever data was in RAM is lost. Volatile random access memory (RAM) devices may be further divided into two categories, including static random access memory (SRAM) and dynamic random access memory (DRAM). SRAM may be comprised of flip-flop latches, which each retain one bit of data for as long as power is maintained, while DRAM may be comprised of one or more memory cells. Each memory cell may be made up from one transistor and a capacitor. RAM is usually used to designate a data memory having a multiplicity of memory cells, each of which may store a datum and which can be accessed selectively and directly to selectively write in or read out data. RAMs, such as SRAM or DRAM, generally comprise a multiplicity of addresses for writing therein data. Data in the addresses may be accessed, for example, through data latches for performing operations, e.g., programming, on a memory cell array, e.g., a non-volatile memory cell array.

Over time, memory cells in the DRAM or other memory subsystems may fail and potentially cause errors when accessed. These individual bad memory cells may result in large blocks of memory being taken out of the memory maps for the memory system. Further, the loss of all or a portion of main memory 108 may lead to performance issues in data processing system 100 and result in a data processing system repair action to replace faulty components. In order to reduce performance issues within data processing system 100 and reduce repair actions due to memory system/subsystem failures, the illustrative embodiments use cache that is embedded in a memory hub device of a memory module to replace failed memory cells. When NB/MCH) 102 detects an error in data that is read from a memory device on a memory module, NB/MCH) 102 will correct the data and attempt to write the data back to memory device replacing the data that is in error in memory device. Then, NB/MCH) 102 rereads the data from memory device and checks the data for errors.

If the data is correct on the second read then the error was a transient error and NB/MCH) 102 logs the read of the data as such. However, if the data is still incorrect on the second read, then NB/MCH) 102 logs the specific memory cell(s) in the memory device as bad and indicates that the memory device and/or memory module as needing to be repaired or replaced. To repair the memory location NB/MCH) 102 then issues a write operation to cache that is embedded in the memory hub device with the corrected data for the faulty memory cell(s) in memory device. Once the write of the corrected data is complete, all read and/or write operations from NB/MCH) 102 to the affected address will use the data from the cache embedded in the memory hub device instead of the data from memory device. This replacement on a read operation may be managed by the NB/MCH 102 by maintaining a directory of the addresses stored in the memory hub's cache or it may be managed transparent to the NB/MCH 102 by maintaining the directory for the memory hub's cache within the memory hub itself.

Figure 2:
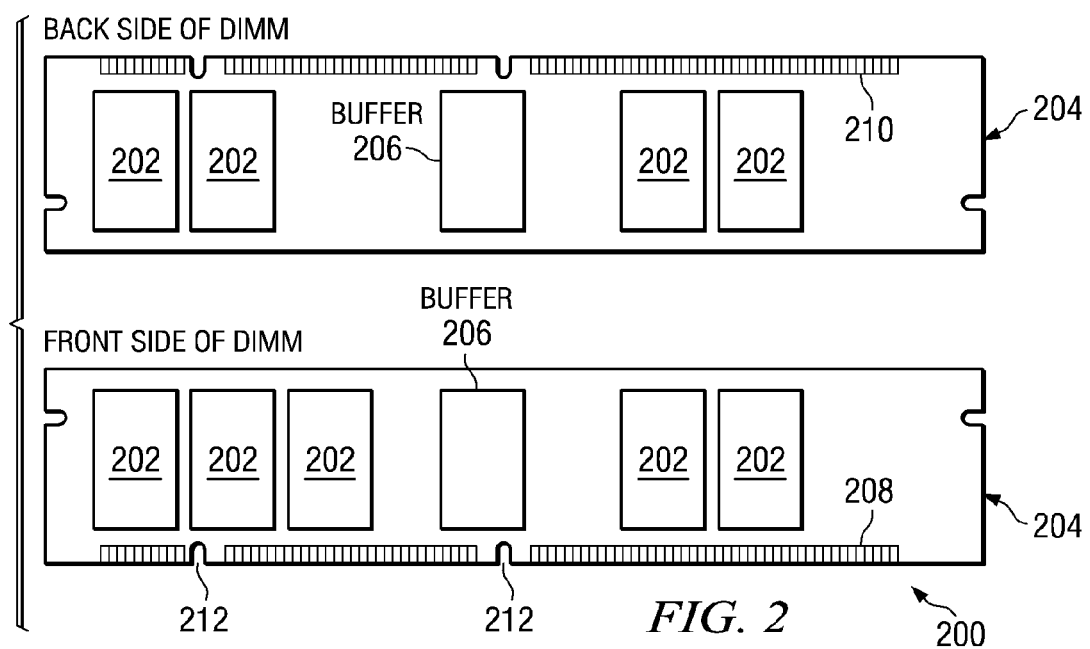
FIG. 2 depicts an exemplary synchronous memory module, such as a dual in-line memory module (DIMM)

FIG. 2 depicts an exemplary memory module, such as a dual in-line memory module (DIMM). Memory module 200 depicted in FIG. 2 may be part of main memory in a data processing device or system, such as main memory 108 in data processing system 100 of FIG. 1. Memory module 200 depicts a front planar side and a back planar side of a DIMM design for nine synchronous dynamic random access memory (SDRAM) chips 202, which may also be referred to as memory devices. In the depiction of FIG. 2, the backside view of the DIMM (top of drawing) may be rotated down such that the notches, or keys, on the edges are aligned with the notches, or keys, on the edges of the front side view of the DIMM (bottom of drawing).

In the depicted example, SDRAM chips 202 are arranged on the front and back sides of printed circuit board 204 with corresponding buffer 206 centrally disposed on each side. Thus, SDRAM chips 202 may be referred to as being disposed on a right side and a left side, relative to buffer 206, of the front side and on a right side and a left side, relative to buffer 206, of the back side. When viewed as an assembled memory module, connector pins 208 on the front side of printed circuit board 204 are disposed along a common edge with connector pins 210 on the back side of printed circuit board 204.

Keys 212 provide a positive mechanical interlock for systems solely supporting DRAM or SDRAM. In the exemplary embodiment, systems supporting both DRAM and SDRAM would have no connector key in this position. A side edge key may be used to inform the controller of the type of memory technology employed, e.g., flash write, EPROM, etc. or in other embodiments, may be used to identify operating voltage or other operational features for which a mechanical means is optimal to prevent system or module damage. Memory module 200 may be coupled to a memory controller of a data processing system, which controls the reading and writing of data from and to memory module 200. The DIMM depicted in FIG. 2 includes 168 pins in the exemplary illustration, whereas subsequent DIMMs may be constructed with pin-counts ranging from 100 pins to over 300 pins, and in alternate exemplary embodiments, pins may be placed on more than one edge to permit interconnection to alternate interfaces (e.g. test, diagnostic, characterization, add-on memory/extended memory, etc).

Figure 3:
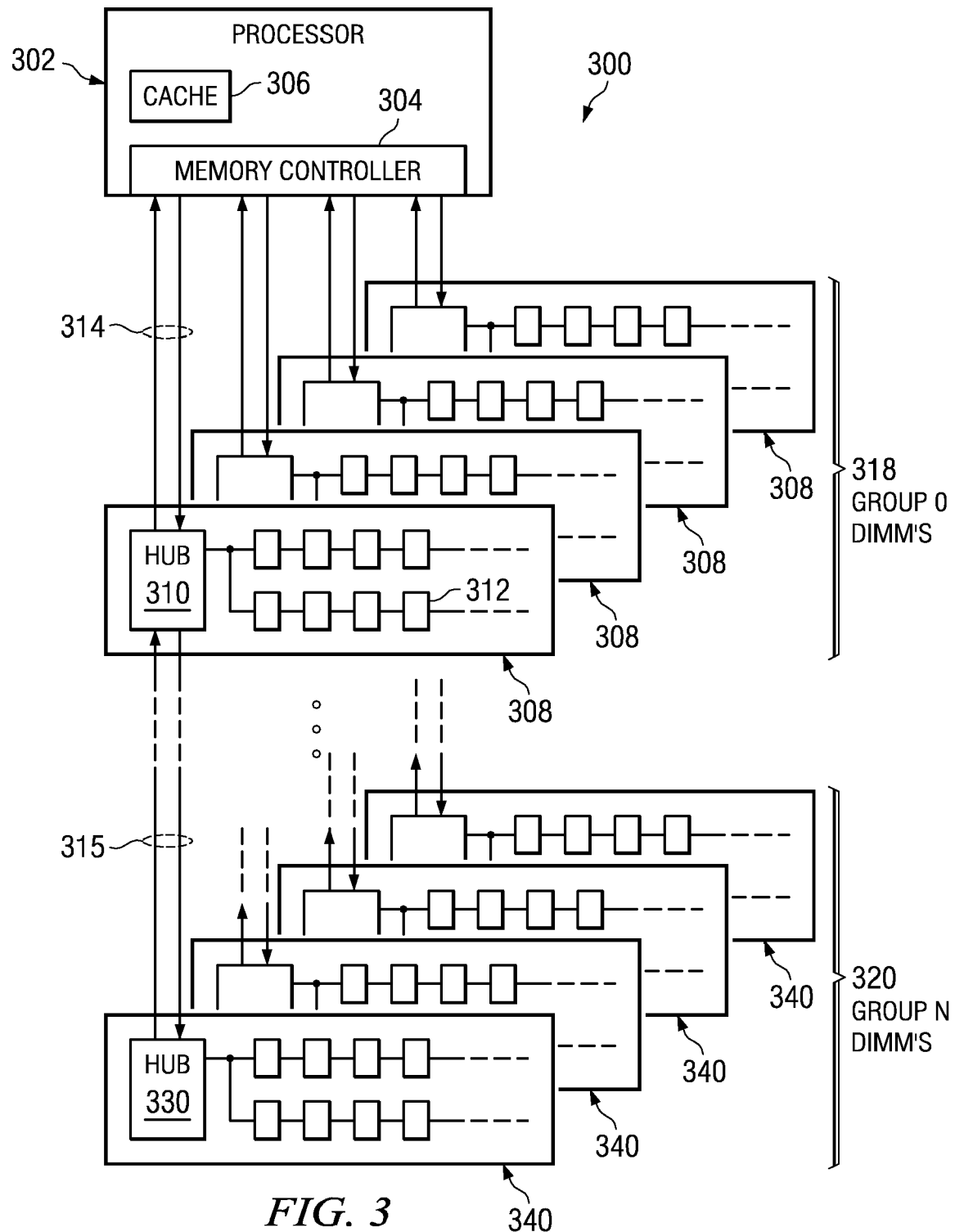
FIG. 3 illustrates an exemplary data processing system coupled to a subsystem of memory modules.

FIG. 3 illustrates an exemplary data processing system coupled to a subsystem of memory modules. Data processing system 300 includes processor 302, with memory controller 304 and cache 306 integrated thereon, and one or more memory modules 308, such as memory module 200 of FIG. 2. Each of the memory modules 308 may include a memory hub device 310 connected to one or more memory devices 312. Each of memory modules 308 connects via bus structures 314 or memory channels that are connected to processor 302 through a cascade interconnect bus structure, which may also be referred to as a hub-and-spoke topology. Memory controller 304 is interconnected to memory hub devices 310 of the memory modules 308 via one or more memory channels 314. Memory hub devices 310 may also be interconnected to other memory hub devices 330 of other memory modules 340 in an nth group of memory modules, such as module groups 318 or 320, or to a standalone repeater hub device using memory channel 315.

Each memory hub device 310 and 330 provides one or more low speed connection(s) to groups of memory devices 312 following, for example, the fully buffered DIMM standard. The connections to the memory devices may include both common and independent signals to the one or more memory devices, with the signals comprising one or more of data, address, command, control, status, reset, and other signals present in contemporary or future memory devices. Multiple identically configured memory modules 308 are logically grouped together into module groups 318 and 320, and may be operated on in unison or with a subset of the modules selected based on the commands issued by memory controller 304 to provide for optimal latency, bandwidth, and error correction effectiveness for system memory cache line transfer, diagnostics, and other communication modes to the memory storage.

In the exemplary embodiment, memory controller 304 translates system requests for memory access into packets according to a memory hub device communication protocol. Typically, memory write packets contain at least a command, address, and associated data. Memory read packets typically contain at least a command and address, and imply that an expected packet will be returned which contains the requested data and/or information related to the read request. Memory controller 304 sends the memory write packets and memory read packets to memory hub device 310 of a memory module 308. Memory hub device 310 routes the packets to a corresponding memory device 312 associated with memory hub device 310 or another memory hub device 330 of another memory module 340, or a standalone repeater hub device. The details of how memory hub device 310 may route the packets in this manner will be provided with reference to FIG. 4 hereafter.

Figure 4:
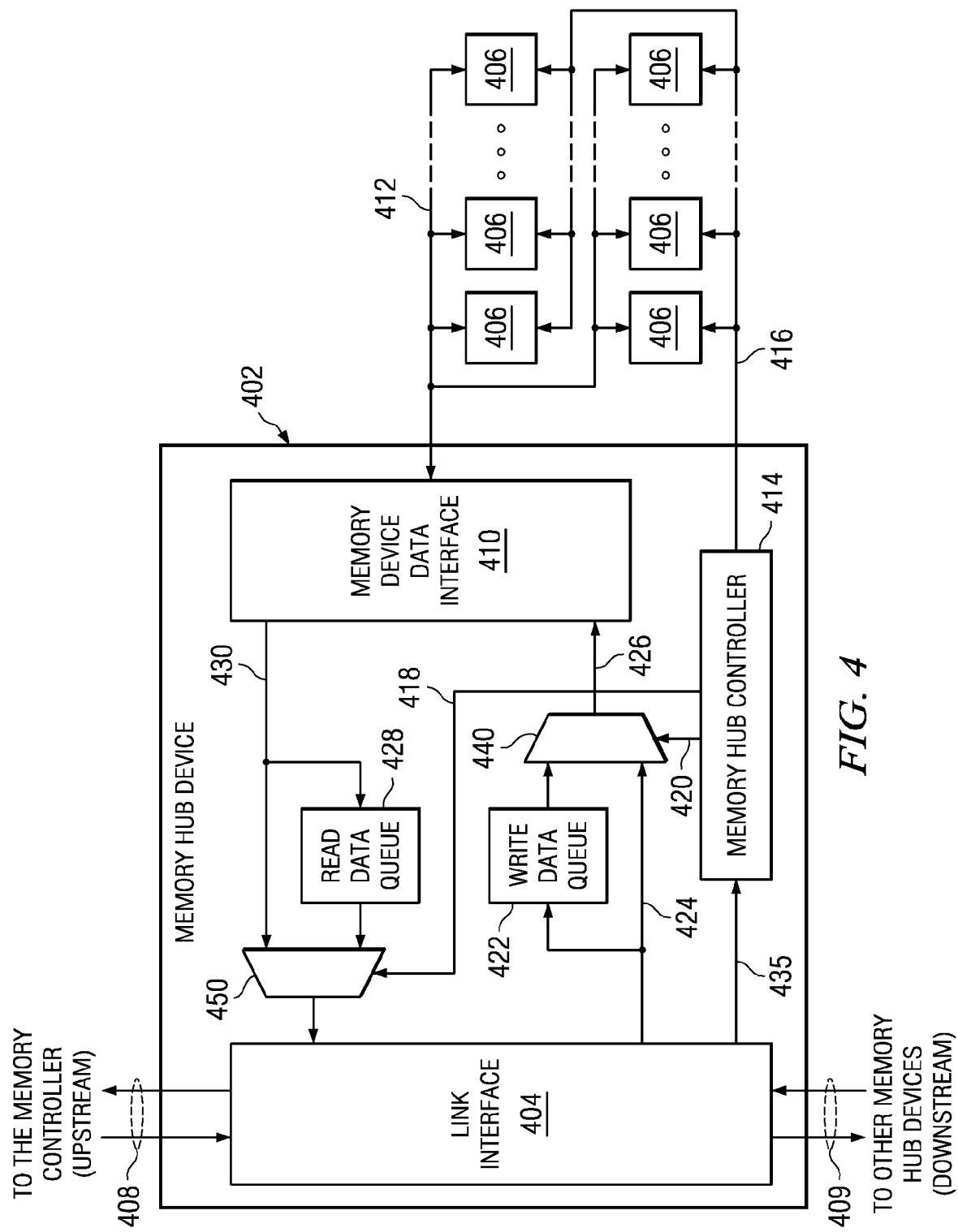
FIG. 4 depicts an exemplary block diagram of a memory hub device of a memory module.

FIG. 4 depicts an exemplary block diagram of a memory hub device of a memory module. Memory hub device 402, such as memory hub device 310 of FIG. 3, may be connected to a memory controller (not shown), such as memory controller 304 of FIG. 3, through memory channel 408, which may be a multi-drop bus structure, point-to-point bus structure, or the like, that may further include a cascade connection to one or more additional memory hub devices or standalone repeater hub device. In the exemplary embodiment, memory channel 408 is a high bandwidth bus structure on which memory access requests are transmitted and received by the memory controller through the memory channel to and from memory hub device 402.

Exemplary memory hub device 402 comprises link interface 404 that receives high-speed memory access requests from an upstream or downstream memory hub device (not shown) or from a memory controller (not shown) via memory channel 408 or 409. Link interface 404 also provides the means to re-synchronize, translate, and re-drive high-speed memory access requests to memory devices 406 and/or to re-drive the high-speed memory access requests downstream or upstream on memory channel 409 as applicable using known memory system communication protocols. Link interface 404 may also receive read data packets from a downstream or upstream memory hub device (not shown) on memory channel 409. Link interface 404 may select between the read data packets from the downstream or upstream memory hub device and the data from memory devices 406 internal to memory hub device 402 using known memory system communication protocols, and then send the data upstream or downstream on memory channel 408.

Memory hub controller 414 responds to access request packets, i.e. write packets and read packets, by responsively driving memory devices 406 using memory device address and control bus 416. Memory hub controller 414 also controls data flow by directing read data flow selector 418 and write data flow selector 420. Link interface 404 decodes the data packets received from the memory controller and directs the address and command information to memory hub controller 414. Write data from link interface 404 may be temporarily stored in write data queue 422 before being provided to multiplexer 440. Alternatively, the write data may be directly driven to multiplexer 440 via internal bus 424. Memory hub controller 414 uses the address of the write data and control information from the write packet to control write data flow selector 420 and, thus, multiplexer 440 such that multiplexer 440 sends the write data from write data queue 422, where the address specific write data may be stored, or internal bus 424 if the address specific write data is sent directly from link interface 404. The write data may then be sent via internal bus 426 to memory device data interface 410. Memory device data interface 410 then sends the write data to memory devices 406 via memory device data bus 412. While all of memory devices 406 receive the write data, only the memory device having the address of the write data actually stores the write data.

Read data may also be provided from memory devices 406 to memory device data interface 410 via memory device data bus 412. Memory device data interface 410 may provide the read data to multiplexer 450 directly via internal bus 430 or indirectly via read data queue 428 and internal bus 430. Multiplexer 450 outputs data to link interface 404 using read data flow selector 418 under control of memory hub controller 414. Memory hub controller 414 uses the address of the read data to control read data flow selector 418 and, thus, multiplexer 450 so that multiplexer 450 sends read data from read data queue 428, where the address specific read data may be stored, or internal bus 430 if the address specific read data is to be sent directly to link interface 404. Link interface 404 may then transmit the read data upstream on memory channel 408 to a memory controller in a processor as one or more read reply packet(s).

In the exemplary embodiments, memory device data interface 410 is an eight-byte data interface that manages the technology-specific data interface with memory devices 406, and further controls the bi-directional memory device data bus 412. However, memory device data interface 410 may be comprised of more or less bytes based on the application requirements, alternate reliability structures (requiring more or less data bits), mechanical (and other) limitations or the like.

As an example of the command flow for a write command, when the memory controller, such as memory controller 304 of FIG. 3, issues a write command to memory devices 406 on memory hub device 402, the memory controller will transmit both a write command and write data to memory hub device 402 via memory channel 408. Link interface 404 decodes the address information associated with the write data and, if the write data is targeted to memory devices 406, link interface 404 moves the write data to a buffer in write data queue 422. The selection of a buffer may be determined in many ways, such as a first in first out queuing method, a buffer implicitly defined in the write command, or other buffer management implementation. Memory hub device 402 generally stores the write data in write data queue 422 prior to the write command being issued, but, depending on the protocol of memory devices 406 and memory channel 408, some or all of the write data may be transferred directly from link interface 404 to memory device data interface 410 via multiplexer 440 under control of memory hub controller 414 and write data flow selector 420. Memory hub controller 414 uses the address of the write data and write command to control write data flow selector 420 and, thus, multiplexer 440 so that multiplexer 440 sends the write data from write data queue 422, where the address specific write data may be stored, or internal bus 424 if the address specific write data is sent directly from link interface 404.

After the write data has been transferred, the memory controller will issue a write command to link interface 404 on memory channel 408. Control logic in link interface 404 will in parallel forward the write command to downstream memory hub devices on memory channel 409 and further decode the write command to determine if the write command is targeted at memory devices 406 attached to memory hub device 402. If the write command is targeted for memory devices 406, link interface 404 forwards the write command to memory hub controller 414 to be executed via internal bus 435. Memory hub controller 414 converts the write command into the correct protocols for memory devices 406 installed on memory module. Memory hub controller 414 sends the write command to memory devices 406 over memory device address and control bus 416. While all of memory devices 406 receive the write data command, only the memory device with the address of the write data actually executes the write command. If the write data is stored in write data queue 422, memory hub controller 414 transfers, at an appropriate time, the write data from write data queue 422 to memory device data interface 410 using write data flow selector 420. Memory device data interface 410 forwards the write data to memory devices 406 on memory device data bus 412.

An example of the command flow for a read command, when memory hub device 402 receives a read command on memory channel 408, control logic in link interface 404 will in parallel forward this read command to any downstream memory hub device on memory channel 409, and further decode the read command to determine if the read command is targeted at memory device 406 attached to memory hub device 402. If link interface 404 determines that the read command is targeted for memory hub device 402, link interface 404 forwards the read command using internal bus 435 to memory hub controller 414 to be executed. Memory hub controller 414 converts the read command into the correct protocols for memory devices 406 installed on the memory module. Memory hub controller 414 then sends the read command to memory devices 406 over memory device address and control bus 416. While all of memory devices 406 receive the read data command, only the memory device with the address of the read data actually executes the read command and sends the read data to memory device data interface 410. Memory devices 406 execute the read command and transfer a read data packet to memory device data interface 410 over memory device data bus 412.

Under control of memory hub controller 414, memory device data interface 410 transfers the read data packet to either read data queue 428 or directly to link interface 404 to be transferred back to the memory controller using memory channel 408. Memory hub controller 414 uses the address of the read data to control read data flow selector 418 and, thus, multiplexer 450 so that multiplexer 450 sends the read data from read data queue 428, where the address specific read data may be stored, or internal bus 430 if the address specific read data is to be sent directly to link interface 404. If the read data is stored in read data queue 428, memory hub controller 414 will decide when to move the stored data to link interface 404 depending on the state of read data queue 428 and the state of link interface 404. If there is already data in read data queue 428 pending transfer to link interface 404, then memory hub controller 414 directs the new read data to read data queue 428. Memory hub controller 414 directs data out of read data queue 428 in a first in, first out manner. Additionally, if link interface 404 is busy moving data from memory channel 409, then memory hub controller 414 delays the transfer of read data until there is an opening on memory channel 408. Any known method may be used to manage read data queue 428.

The illustrative embodiments provide mechanisms for using cache that is embedded in a memory hub device of a memory module to replace failed memory cells within a memory device of the memory module. One illustrative embodiment provides a cache embedded in a memory hub device of a memory module that stores corrected data for one or more faulty memory cells in memory device of the memory module. Based on a memory controller determining that one or more memory cells have failed, the memory controller performs a write operation to the cache within the memory hub device with the data that was originally to be written to the failed memory cell. Once this write of the corrected data is complete, all read and/or write operations from the memory controller will use the data from the cache embedded in the memory hub device instead of the data from memory device for the particular failed memory cell.

Figure 5:
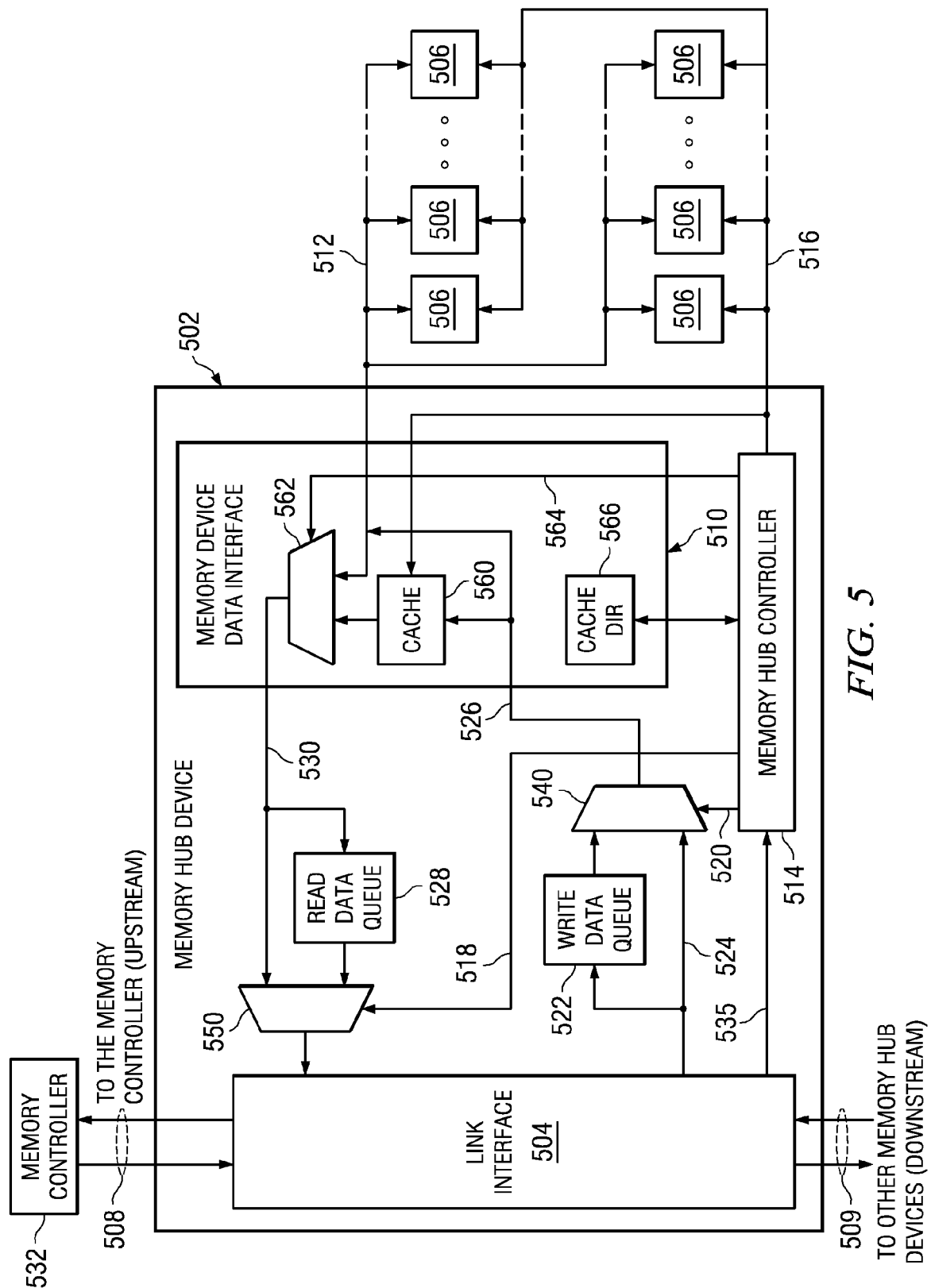
FIG. 5 depicts a buffered memory module within a memory system that comprises a cache within a memory hub device in accordance with one illustrative embodiment.

FIG. 5 depicts an exemplary buffered memory module 500 within a memory system that comprises a cache within a memory hub device in accordance with one illustrative embodiment. In order to reduce performance issues within a computer system and reduce repair actions due to memory system/subsystem failures, the illustrative embodiments implement the cache within a memory hub device of the memory module to replace failed memory cell(s) within the memory device of the memory module.

With reference to FIG. 5, exemplary memory hub device 502 includes, in addition to the elements particular to the illustrative embodiments, elements that are similar to elements depicted in memory hub device 402 of FIG. 4. Thus, elements in FIG. 5 that are not specifically described as operating differently from elements in FIG. 4 are intended to operate in a similar manner as their corresponding elements in FIG. 4. For example, memory hub device 502 includes link interface 504, memory devices 506, and memory channels 508 and 509, each of which operate in a similar manner to that described with the corresponding elements in FIG. 4. However, in this implementation, memory device data interface 510 also includes cache 560. Cache 560 may be any type of cache, such as content addressable cache or address mapped cache, or the like. The addition of cache 560 is a significant and innovative addition that enables dramatic performance benefits on a single module, by allowing cache 560 to replace one or more failed memory cells of memory device 506.

As described above, memory hub controller 514 may respond to access request packets, i.e. write packets and read packets, by responsively driving memory devices 506 using memory device address and control bus 516. Memory hub controller 514 may also control data flow by directing read data flow selector 518 and write data flow selector 520. Link interface 504 may decode the access request packets received from memory controller 532 and may direct the address and command information to memory hub controller 514. In addition to standard write packets that write data to memory devices 506, there may also be write cache commands that write data into cache 560 to save updated data that is used to replace damaged locations in memory devices 506. For all read and write packets, memory hub controller 514 may check the contents of cache directory 566 to determine if there is data that is stored in cache 560 that is to be used in place of a bad location in memory devices 506 or data in cache 560 that needs to be updated on a write packet request.

Data may be initially stored in cache 560 in memory hub 502 when memory controller 532 determines that an error that occurred on a read operation is a hard error in memory devices 506. Memory controller 532 may determine if there is a hard error by correcting an initial error on the initial read and issuing a write packet operation to store the corrected data back into memory device 506. Memory controller 532 may then read the memory location in memory devices 506 again looking to see if the error has been corrected. If, on the reread of the memory location in memory devices 506, memory controller 532 determines that no error exists, then the error was a transient error and memory controller 532 may log the error as a soft failure or transient error. If memory controller 532 detects the error again, then memory controller 532 may identify the location in the memory devices 506 has a hard failure that needs to be corrected. For the case of a hard error, memory controller 532 may issue a write cache command to update cache directory 566 and cache 560 with the corrected data so that future accesses to that location will be able to use the data out of cache 560 instead of the data from the failing location in memory devices 506.

As an example of the command flow for a read command, when memory hub device 502 receives a read command on memory channel 508, control logic in link interface 504 may in parallel forward this read command to any downstream memory hub device on memory channel 509, and further decode the read command to determine if the read command is targeted at memory device 506 attached to memory hub device 502. If link interface 504 determines that the read command is targeted for memory hub device 502, link interface 504 may forward the read command using internal bus 535 to memory hub controller 514 to be executed. Memory hub controller 514 may convert the read command into the correct protocols for memory devices 506 installed on the memory module. Memory hub controller 514 may then send the read command to memory devices 506 over memory device address and control bus 516. While all of memory devices 506 receive the read data command, only the memory device with the address of the read data actually executes the read command and sends the read data to memory device data interface 510. Memory devices 506 may execute the read command and transfer a read data packet to memory device data interface 510 over memory device data bus 512.

Memory hub controller 514 may in parallel check cache directory 566 to see if data for the read operation has been stored in cache 560. If there is no entry in cache directory 566 for the address of the read operation, then memory hub controller 514 may read the data through multiplexer 562 from memory devices 506 using read data flow selector 564. If there is an entry in cache directory 566 for the address of the read operation then memory hub controller 514 may read the data through multiplexer 562 from cache 560 using read data flow selector 564. The data in cache 560 may be a replacement for the full memory access from memory devices 506 or it may just replace the output of a single memory device of memory devices 506. Memory hub controller 514 may take the information from cache directory 566 and issue the correct select signals to multiplexer 562 using read data flow selector 564 to merge in the replacement data from cache 560 with the remaining data from memory devices 506. Multiplexer 562 may provide the read data to multiplexer 550 directly via internal bus 530 or indirectly via read data queue 528 and internal bus 530 using memory device flow selector 564 under control of memory hub controller 514.

Multiplexer 550 may output data to link interface 504 using read data flow selector 518 under control of memory hub controller 514. Memory hub controller 514 may use the address of the read data to control read data flow selector 518 and, thus, multiplexer 550 so that multiplexer 550 sends read data from read data queue 528, where the address specific read data may be stored, or internal bus 530 if the address specific read data is to be sent directly to link interface 504. Link interface 504 may then transmit the read data upstream on memory channel 508 to memory controller 532 in a processor as one or more read reply packet(s).

As an example of the command flow for a write command, when memory controller 532 issues a write command to memory devices 506 on memory hub device 502, memory controller 532 may transmit both a write command and write data to memory hub device 502 via memory channel 508. Link interface 504 may decode the address information associated with the write data and, if the write data is targeted to memory devices 506, link interface 504 may move the write data to a buffer in write data queue 522. The selection of a buffer may be determined in many ways, such as a first in first out queuing method, a buffer implicitly defined in the write command, or other buffer management implementation. Memory hub device 502 may generally store the write data in write data queue 522 prior to the write command being issued, but, depending on the protocol of memory devices 506 and memory channel 508, some or all of the write data may be transferred directly from link interface 504 to memory device data interface 510 via multiplexer 540 under control of memory hub controller 514 and write data flow selector 520. Memory hub controller 514 may use the address of the write data and write command to control write data flow selector 520 and, thus, multiplexer 540 so that multiplexer 540 sends the write data from write data queue 522, where the address specific write data may be stored, or internal bus 524 if the address specific write data is sent directly from link interface 504.

After the write data has been transferred, memory controller 532 may issue a write command to link interface 504 on memory channel 508. Control logic in link interface 504 may in parallel forward the write command to downstream memory hub devices on memory channel 509 and further decode the write command to determine if the write command is targeted at memory devices 506 attached to memory hub device 502. If the write command is targeted for memory devices 506, link interface 504 may forward the write command to memory hub controller 514 to be executed via internal bus 535. Memory hub controller 514 may convert the write command into the correct protocols for memory devices 506 installed on memory module. Memory hub controller 514 may send the write command to memory devices 506 over memory device address and control bus 516. While all of memory devices 506 receive the write data command, only the memory device with the address of the write data actually executes the write command. If the write data is stored in write data queue 522, memory hub controller 514 may transfer, at an appropriate time, the write data from write data queue 522 to memory device data interface 510 using write data flow selector 520. Memory device data interface 510 may forward the write data to memory devices 506 on memory device data bus 512.

Memory hub controller 514 may in parallel check cache directory 566 to see if data for the write operation needs to be stored in cache 560. If there is no entry in cache directory 566 for the address of the write operation, then the write operation will complete as described above. If there is an entry in cache directory 566 for the address of the write operation, then memory hub controller 514 may send the write data to cache 560 via internal bus 526. Memory hub controller 514 may also issue the controls over memory device address and control bus 516 to write cache 560 along with the write of the memory devices 506. Both cache 560 and memory devices 506 may be written in this case as the data in cache 560 may be a replacement for the full memory access from memory devices 506 or it may just replace the output of a single memory device of memory devices 506. If only cache 560 were written then in all cases the full memory access would have to be stored there even though only a single bit may be bad in the memory device.

A write cache command is similar to a standard write command with the exception that instead of checking cache directory 566 for a hit in cache 560, memory hub controller 514 uses the write cache command to update the cache directory 566 with a new entry and stores the data in cache 560. As an example of the command flow for a write cache command, when memory controller 532 issues a write cache command to memory devices 506 on memory hub device 502, the memory controller may transmit both a write cache command and write data to memory hub device 502 via memory channel 508. Link interface 504 may decode the address information associated with the write data and, if the write data is targeted to memory devices 506, link interface 504 may move the write data to a buffer in write data queue 522. The selection of a buffer may be determined in many ways, such as a first in first out queuing method, a buffer implicitly defined in the write command, or other buffer management implementation. Memory hub device 502 may generally store the write data in write data queue 522 prior to the write command being issued, but, depending on the protocol of memory devices 506 and memory channel 508, some or all of the write data may be transferred directly from link interface 504 to memory device data interface 510 via multiplexer 540 under control of memory hub controller 514 and write data flow selector 520. Memory hub controller 514 may use the address of the write data and write command to control write data flow selector 520 and, thus, multiplexer 540 so that multiplexer 540 sends the write data from write data queue 522, where the address specific write data may be stored, or internal bus 524 if the address specific write data is sent directly from link interface 504.

After the write data has been transferred, memory controller 532 may issue a write cache command to link interface 504 on memory channel 508. Control logic in link interface 504 may in parallel forward the write cache command to downstream memory hub devices on memory channel 509 and further decode the write cache command to determine if the write cache command is targeted at memory devices 506 attached to memory hub device 502. If the write cache command is targeted for memory devices 506, link interface 504 may forward the write cache command to memory hub controller 514 to be executed via internal bus 535. Memory hub controller 514 may convert the write cache command into the correct protocols for memory devices 506 installed on memory module. Memory hub controller 514 may send the write cache command to memory devices 506 over memory device address and control bus 516. While all of memory devices 506 receive the write data command, only the memory device with the address of the write data actually executes the write command. If the write data is stored in write data queue 522, memory hub controller 514 may transfer, at an appropriate time, the write data from write data queue 522 to memory device data interface 510 using write data flow selector 520. Memory device data interface 510 may forward the write data to memory devices 506 on memory device data bus 512.

Memory hub controller 514 may in parallel update cache directory 566 with the error information for the new entry in cache 560. The write data will be sent to cache 560 over internal bus 526 and memory hub controller 514 may issue the controls over memory device address and control bus 516 to write cache 560 along with the write of memory devices 506. Both cache 560 and memory devices 506 may be written in this case as the data in cache 560 may be a replacement for the full memory access from memory devices 506 or it may just replace the output of a single memory device of memory device 506. If only cache 560 were written, then in all cases the full memory access would have to be stored there even though only a single bit may be bad in the memory device.

Thus, these illustrative embodiments provide an embedded cache within memory hub device 502 that provides for replacing defective memory cell(s) within memory device 506. Since cache 560 is accessed in parallel with memory devices 506 and since the access time of cache 560 is lower then memory devices 506, using cache 560 to replace defective memory cell(s) within memory device 506 is totally transparent and has no impact on memory latency or performance of the memory module.

Thus, the illustrative embodiments provide mechanisms for using cache that is embedded in a memory hub device to replace failed memory cells. In the illustrative embodiments an access request is received, in the memory hub device integrated in a memory module, for accessing a set of memory devices of the memory module coupled to the memory hub device and a cache integrated in the memory hub device. Data is transferred between a memory device data interface of the memory hub device and at least one of the set of memory devices or the cache. A memory hub controller integrated in the memory hub device controls the data that is read or written by the memory device data interface to the cache based on a determination whether one or more memory cells within the set of memory devices has failed.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A memory system comprising:
a memory hub device integrated in a memory module;
a memory device data interface integrated in the memory hub device that communicates with a set of memory devices coupled to the memory hub device and a cache integrated in the memory hub device;
a memory hub controller integrated in the memory hub device, wherein the memory hub controller controls the data that is read or written by the memory device data interface to the cache based on a determination whether one or more memory cells within the set of memory devices has failed;
a link interface, coupled to the memory device data interface and the memory hub controller, that provides a communication path between the memory module and an external memory controller, and wherein the memory hub controller controls the transfer of data between the memory device data interface and the link interface;
a first multiplexer coupled to the link interface and a second multiplexer in the memory device data interface; and
a read data queue coupled to the first multiplexer and the second multiplexer in the memory device data interface, wherein the memory hub controller controls the transfer of data between the second multiplexer and the link interface by sending one or more control signals to the first multiplexer to select either a direct input from the second multiplexer or an input from the read data queue for output by the first multiplexer to the link interface.

2. The memory system of claim 1, wherein determining whether one or more memory cells within the set of memory devices have failed comprises:
detecting an error in read data that is read from the one or more memory cells;
correcting the error in the read data thereby forming corrected data;
writing the corrected data to the one or more memory cells;
rereading the corrected data from the one or more memory cells;
determining if the error still exists within the corrected data; and
responsive to a persistence of the error in the corrected data, indicating the one or more memory cells as failed.

3. The memory system of claim 2, further comprising:
responsive to an absence of the error in the corrected data, recording the error as a transient error.

4. The memory system of claim 1, wherein the cache is at least one of content addressable cache or address mapped cache.

5. The memory system of claim 1, wherein the memory hub controller controls the transfer of data between at least one of the set of memory devices or the cache to the first multiplexer by sending one or more control signals to the second multiplexer to select either data from the set of memory devices or the data from the cache.

6. The memory system of claim 5, wherein the memory hub controller sends a control signal to the second multiplexer to select the input from the cache or the set of memory devices based on an address of the data.

7. The memory system of claim 1, wherein the memory hub controller sends a control signal to the first multiplexer to select the input from the read data queue based on a state of the read data queue and a state of the link interface.

8. The memory system of claim 1, wherein the memory module is one of a dual in-line memory module (DIMM) or a single in-line memory module (SIMM).

9. The memory system of claim 1, wherein the memory module is part of a data processing device.

10. The memory system of claim 1, wherein the memory module is part of a main memory of a data processing system.

11. A data processing system, comprising:
a processor; and
a memory coupled to the processor, wherein the memory comprises one or more memory modules, each memory module comprising:
a memory hub device integrated in the memory module;
a memory device data interface integrated in the memory hub device that communicates with a set of memory devices coupled to the memory hub device and a cache integrated in the memory hub device;
a memory hub controller integrated in the memory hub device, wherein the memory hub controller controls the data that is read or written by the memory device data interface to the cache based on a determination whether one or more memory cells within the set of memory devices has failed;

a link interface coupled to the memo device data interface and the memory hub controller, that provides a communication path between the memory module and an external memory controller, and wherein the memory hub controller controls the transfer of data between the memory device data interface and the link interface;

a first multiplexer coupled to the link interface and a second multiplexer in the memory device data interface; and a read data queue coupled to the first multiplexer and the second multiplexer in the memory device data interface, wherein the memory hub controller controls the transfer of data between the second multiplexer and the link interface by sending one or more control signals to the first multiplexer to select either a direct input from the second multiplexer or an input from the read data aueue for output by the first multiplexer to the link interface.

12. The data processing system of claim 11, wherein determining whether the one or more memory cells within the set of memory devices have failed comprises the processor executing instructions stored in the memory that cause the processor to:

detect an error in read data that is read from the one or more memory cells;

correct the error in the read data thereby forming corrected data;

write the corrected data to the one or more memory cells;

reread the corrected data from the one or more memory cells;

determine if the error still exists within the corrected data; and responsive to a persistence of the error in the corrected data, indicate the one or more memory cells as failed.

13. The data processing system of claim 12, wherein the instructions further cause the processor to:

responsive to an absence of the error in the corrected data, record the first error as a transient error.

14. The data processing system of claim 11, wherein the cache is at least one of content addressable cache or address mapped cache.

15. A method for using cache that is embedded in a memory hub device to replace failed memory cells, comprising:

receiving, in the memory hub device integrated in the memory module, an access request for accessing a set of memory devices of the memory module coupled to the memory hub device and a cache integrated in the memory hub device;

transferring data between a memory device data interface of the memory hub device and at least one of the set of memory devices or the cache;

controlling, by a memory hub controller integrated in the memory hub device, the data that is read or written by the memory device data interface to the cache based on a determination whether one or more memory cells within the set of memory devices has failed;

controlling, by the memory hub controller, the transfer of data between the memory device data interface and a link interface, wherein the link interface is coupled to the memory device data interface and the memory hub controller and wherein the link interface provides a communication path between the memory module and an external memory controller; and controlling, by the memory hub controller, the transfer of data between a second multiplexer and the link interface by sending one or more control signals to a first multiplexer to select either a direct input from the second multiplexer or an input from a read data queue for output by the first multiplexer to the link interface, wherein the first multiplexer is coupled to the link interface, wherein the second multiplexer is in the memory device data interface, and wherein the read data queue is coupled to the first multiplexer and the second multiplexer in the memory device data interface.

16. The method claim 15, wherein determining whether one or more memory cells within the set of memory devices have failed comprises:

detecting an error in read data that is read from the one or more memory cells;

correcting the error in the read data thereby forming corrected data;

writing the corrected data to the one or more memory cells;

rereading the corrected data from the one or more memory cells;

determining if the error still exists within the corrected data; and responsive to a persistence of the error in the corrected data, indicating the one or more memory cells as failed.

17. The method of claim 16, further comprising:

responsive to an absence of the error in the corrected data, recording the first error as a transient error.

18. The method of claim 15, wherein the cache is at least one of content addressable cache or address mapped cache.

* * * * *